United States Patent
Jeddeloh

(10) Patent No.: US 7,765,424 B2
(45) Date of Patent: Jul. 27, 2010

(54) SYSTEM AND METHOD FOR INJECTING PHASE JITTER INTO INTEGRATED CIRCUIT TEST SIGNALS

(75) Inventor: Joseph M. Jeddeloh, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 1377 days.

(21) Appl. No.: 11/207,223

(22) Filed: Aug. 19, 2005

(65) Prior Publication Data

US 2007/0041255 A1    Feb. 22, 2007

(51) Int. Cl.
*G06F 1/24* (2006.01)
(52) U.S. Cl. .................... 713/503; 713/500
(58) Field of Classification Search ............. 713/500, 713/503
See application file for complete search history.

(56) References Cited

U.S. PATENT DOCUMENTS

| | | | |
|---|---|---|---|
| 4,637,020 A | 1/1987 | Schinabeck | 371/20 |
| 4,646,299 A | 2/1987 | Schinabeck et al. | 371/20 |
| 4,717,012 A | 1/1988 | Swapp et al. | 198/425 |
| 4,776,747 A | 10/1988 | Swapp et al. | 414/417 |
| 4,928,062 A | 5/1990 | Miles et al. | 324/158 R |
| 5,055,779 A | 10/1991 | Kerschner et al. | 324/158 F |
| 5,321,702 A | 6/1994 | Brown et al. | 371/27 |
| 5,446,395 A | 8/1995 | Goto | 324/763 |
| 5,539,305 A | 7/1996 | Botka | 324/158.1 |
| 5,615,358 A * | 3/1997 | Vogley | 713/501 |
| 5,652,524 A | 7/1997 | Jennion et al. | 324/765 |
| 5,751,151 A | 5/1998 | Levy et al. | 324/537 |
| 5,805,619 A | 9/1998 | Gardner et al. | 371/61 |
| 5,864,565 A | 1/1999 | Ochoa et al. | 371/24 |
| 5,903,163 A | 5/1999 | Tverdy et al. | 324/760 |
| 6,004,142 A | 12/1999 | Wark | 439/74 |
| 6,087,857 A | 7/2000 | Wang | 327/5 |
| 6,147,506 A | 11/2000 | Ahmad et al. | 324/760 |
| 6,219,305 B1 | 4/2001 | Patrie et al. | 368/113 |
| 6,369,601 B1 | 4/2002 | Ishigaki | 324/765 |
| 6,373,268 B1 | 4/2002 | Dunlap et al. | 324/755 |
| 6,380,755 B1 | 4/2002 | Sato | 324/765 |
| 6,385,694 B1 * | 5/2002 | Arimilli et al. | 711/118 |
| 6,400,173 B1 | 6/2002 | Shimizu et al. | 324/765 |
| 6,407,567 B1 | 6/2002 | Etter | 324/760 |
| 6,438,721 B1 | 8/2002 | Wente | 714/731 |
| 6,449,741 B1 | 9/2002 | Organ et al. | 714/724 |
| 6,551,844 B1 | 4/2003 | Eldridge et al. | 438/14 |
| 6,583,636 B2 | 6/2003 | Brule | 324/755 |
| 6,631,488 B1 | 10/2003 | Stambaugh et al. | 714/746 |

(Continued)

*Primary Examiner*—Tse Chen
(74) *Attorney, Agent, or Firm*—Dorsey & Whitney LLP

(57) ABSTRACT

A memory test system injects phase jitter in memory command, address and write data signals in respective pin groups. A phase interpolator receiving a clock signal is provided for each of the pin groups to generate respective delayed clock signals. The phase shift produced by each of the phase interpolators is determined by delay control values, which are passed to the phase interpolators from respective memory arrays. Each of the memory arrays stores at each address a next address along with a delay control value. The next address is used to access the memory array to obtain next delay control value. The delayed clock signals are applied to a clock input of a respective set of registers for each pin group, and a data input of each of the registers receives one of the memory device signals in the respective pin group.

37 Claims, 5 Drawing Sheets

U.S. PATENT DOCUMENTS

| | | |
|---|---|---|
| 6,642,736 B2 | 11/2003 | Mori et al. .................. 324/765 |
| 6,696,848 B2 | 2/2004 | Robinson .................... 324/755 |
| 6,791,317 B1 | 9/2004 | Walsh et al. ............. 324/158.1 |
| 6,829,181 B1 | 12/2004 | Seitoh ........................ 365/201 |
| 6,856,154 B2 | 2/2005 | Song et al. .................. 324/754 |
| 6,930,503 B2 | 8/2005 | Sher et al. ................... 324/765 |
| 7,188,219 B2 | 3/2007 | Jeddeloh ..................... 711/154 |
| 7,213,082 B2 | 5/2007 | Jeddeloh ........................ 710/5 |
| 7,234,070 B2 | 6/2007 | James ........................ 713/503 |
| 7,243,278 B2 | 7/2007 | Arkin ......................... 714/724 |
| 2004/0034825 A1 | 2/2004 | Jeddeloh ..................... 714/733 |
| 2004/0153267 A1* | 8/2004 | Fishman et al. ............... 702/69 |
| 2005/0023560 A1 | 2/2005 | Ahn et al. ................... 257/200 |
| 2005/0060600 A1 | 3/2005 | Jeddeloh ......................... 714/5 |
| 2005/0278495 A1 | 12/2005 | Lee ............................ 711/168 |
| 2005/0283681 A1 | 12/2005 | Jeddeloh ....................... 714/42 |
| 2005/0289379 A1* | 12/2005 | Teutsch et al. .............. 713/400 |
| 2006/0107186 A1 | 5/2006 | Cowell et al. ............... 714/776 |
| 2006/0206761 A1 | 9/2006 | Jeddeloh ....................... 714/29 |

* cited by examiner

SYSTEM AND METHOD FOR INJECTING PHASE JITTER INTO INTEGRATED CIRCUIT TEST SIGNALS

TECHNICAL FIELD

This invention relates to testing integrated circuit devices, and, more particularly, to testing integrated circuits in the presence of phase jitter in a manner that causes the signals to have phase jitter of the type that is likely to occur in an operating environment.

BACKGROUND OF THE INVENTION

As the operating speeds of integrated circuits such as memory devices continues to increase, the timing margins for test signals applied to and received from the integrated circuits continues to decrease. For example, the period for which a digital signal is valid, known as the "eye," decreases as the data rate increases, thereby making it more difficult for the digital signal to be acquired or captured by a receiving device during the eye. In memory systems, write data signals are normally transmitted to a memory device along with a write data strobe signal. The timing of the write data strobe signal is selected so that a transition of the write data strobe signal will occur at the center of the data eye of the write data signals. As the rate at which the write data signals are transmitted is increased, the period of the data eye is correspondingly decreased.

One factor affecting the location of the data eye is "phase jitter," which is high frequency phase noise that causes rapid changes in the timing at which transitions of digital signals occur. Phase jitter can be caused by a number of sources, such as noise coupled to digital circuits, which causes the switching time of a digital circuit to vary in a random manner. Jitter can also be caused by variations in the propagation time of digital signals coupled through signal lines. The location of the data eye can also be affected by timing skew, duty cycle variation, and other types of unwanted signal distortion. For example, if, as is normally the case, phase jitter is present on write data signals and/or a write strobe signal coupled to a memory device, a transition of the write strobe signal may no longer occur at the center of the data eye for the write data signals. Under these circumstances, the correct write data will not be stored in the memory device. Similar problems exist in coupling other signals, such as command and address signals, to the memory device, as well as coupling read data signals and a read strobe signal from the memory device and coupling digital signals to other devices.

During the fabrication of integrated circuits such as memory devices, it is conventional to test such integrated circuits at several stages during the fabrication process. For example, the integrated circuits are normally connected to a tester with a probe card when the integrated circuits are still in wafer form. In a final test occurring after the integrated circuits have been diced from the wafer and packaged, the integrated circuits are placed into sockets on a load board. The load board is then placed on a test head, typically by a robotic handler. The test head makes electrical contact with conductors on the load board that are connected to the integrated circuits. The test head is connected through a cable to a high-speed tester so that the tester can apply signals to and receive signals from the integrated circuits.

It is important for integrated circuits to be tested under conditions that accurately simulate the conditions they will encounter in normal use. Therefore, phase jitter should be injected into signals applied to an integrated circuit in the course of testing the integrated circuit both during fabrication and after packaging. In the past, attempts have been made to inject phase jitter into test signals using various systems. A typical example of a prior art test system 10 performing this function is shown in FIG. 1. The test system 10 includes a test signal generator 14, which outputs a number of signals on a bus 16. The signals output from the test signal generator 14 may have a pattern determined by data applied to the test signal generator 14 through a JTAG interface. The number of test signals generated will determine the width of the bus 16, and both will be determined by the number of signals that a device under test ("DUT") is adapted to receive. The test signals provided by the test signal generator 14 may be, for example, a set of memory command signals, a set of address signals, and a set of write data signals accompanied by a write data strobe signal.

The test signals coupled through the bus 16 are applied to an interface 20, which includes a register 24 for each of the test signals. Each of the registers 24 has a data input, a clock input and an output. The data input of each of the registers 24 receives a respective one of the test signals from the test signal generator 14. The output of each of the registers 24 is coupled to a respective signal line of a bus 28. The bus 28 is, in turn, connected to the DUT.

The clock inputs of all of the registers 24 in the interface 20 receive an interface clock signal ICLK from the output of a phase interpolator 30. As is well-known in the art, a phase interpolator produces a delayed signal from an input signal by shifting the phase of the input signal by a precisely controlled amount. The degree of precision of the delay of the ICLK signal depends on the precision of the input signal frequency. The phase interpolator 30 can, for example, vary the delay of the ICLK signal in 1 nanosecond increments by using an input signal having a frequency of 5 mHz and using a phase interpolator having 200 phase increments. The phase shift provided by the phase interpolator 30 is determined by a control circuit 34, which receives a phase control value at its control "C" input. The phase control value is a binary number generated by an analog-to-digital ("A/D") converter 36. The magnitude of the phase control value corresponds to the amplitude of an analog signal applied to the input of the A/D converter 36. In the past, this analog signal has been a periodic signal, such as a sine wave.

The clock signal applied to the phase interpolator 30 is generated by a phase-lock loop ("PLL") 38 from an input clock signal $CLK_{IN}$. The PLL 38 ensures that the clock signal applied to the phase interpolator 30 has relatively little jitter and a duty cycle of substantially 50 percent.

In operation, the ICKL signal causes the test signals from the test signal generator 14 to be clocked into respective registers 20. When the test signals are clocked into the registers 24, they also become present at the outputs of the registers 24. Therefore, the transitions of the ICKL signal determines the times that the test signals are applied to the DUT through the bus 28. The sine wave applied to the input of the A/D converter 36 causes the phase interpolator 30 to increase the phase of the ICLK signal responsive to the positive portion of the sine wave and to decrease the phase of the ICLK signal responsive to the negative portion of the sine wave. As the phase of the ICKL signal increases and decreases, the timing at which the test signals are applied to the DUT also increases and decreases in a corresponding manner.

The increase and decrease in the timing at which the test signals are applied to the DUT are intended to simulate phase jitter that are expected to be present in signals received by the DUT during normal use. However, normal jitter is neither regular nor periodic. Instead, jitter is normally somewhat random, and the amplitude of the jitter varies substantially. Therefore, conventional testing systems and methods for injecting jitter in digital test signals do not accurately simulate the jitter that will be present in signals during normal operation. For this reason, a test conducted with the system 10 may indicate that the DUT will function properly under normal operation conditions, when, in fact, it may fail to function properly in normal use because of the presence of phase jitter.

There is therefore a need for a system and method that is capable of injecting phase jitter in digital test signals in a manner that causes the jitter to accurately simulate the type of jitter that is likely to be present in normal operation.

SUMMARY OF THE INVENTION

A system and method for injecting phase jitter in a digital signal includes a delay circuit having an input to which an input clock signal is applied. The delay circuit delays the input clock signal by a delay corresponding to a delay control value applied to a control input of the delay circuit thereby providing a delayed clock signal. The system also includes a memory array storing a plurality of the delay control values at respective addresses. The memory array is coupled to the delay circuit to provide one of the delay control values to the delay circuit when the memory array is accessed at a corresponding address. The memory array is sequentially addressed by a memory array access circuit coupled to the memory array to cause the memory array to sequentially apply corresponding delay control values to the delay circuit. An interface circuit included in the system receives the delayed clock signal and the digital signal. The interface circuit transmits the digital signal responsive to a transition of the delayed clock signal. Therefore, as different delay control values are applied to the delay circuit, the timing of the transitions of the delayed clock signal, and hence the transmissions of the digital signal, vary in a corresponding manner. When providing each of the delay control values to the delay circuit, the memory array may also provide a corresponding next address to the memory array access circuit, which may be used by the access circuit for the next memory array access. As a result, the sequence of delay control values transferred to the delay circuit may be controlled by the data stored in the memory array.

DETAILED DESCRIPTION OF THE INVENTION

Figure 1:
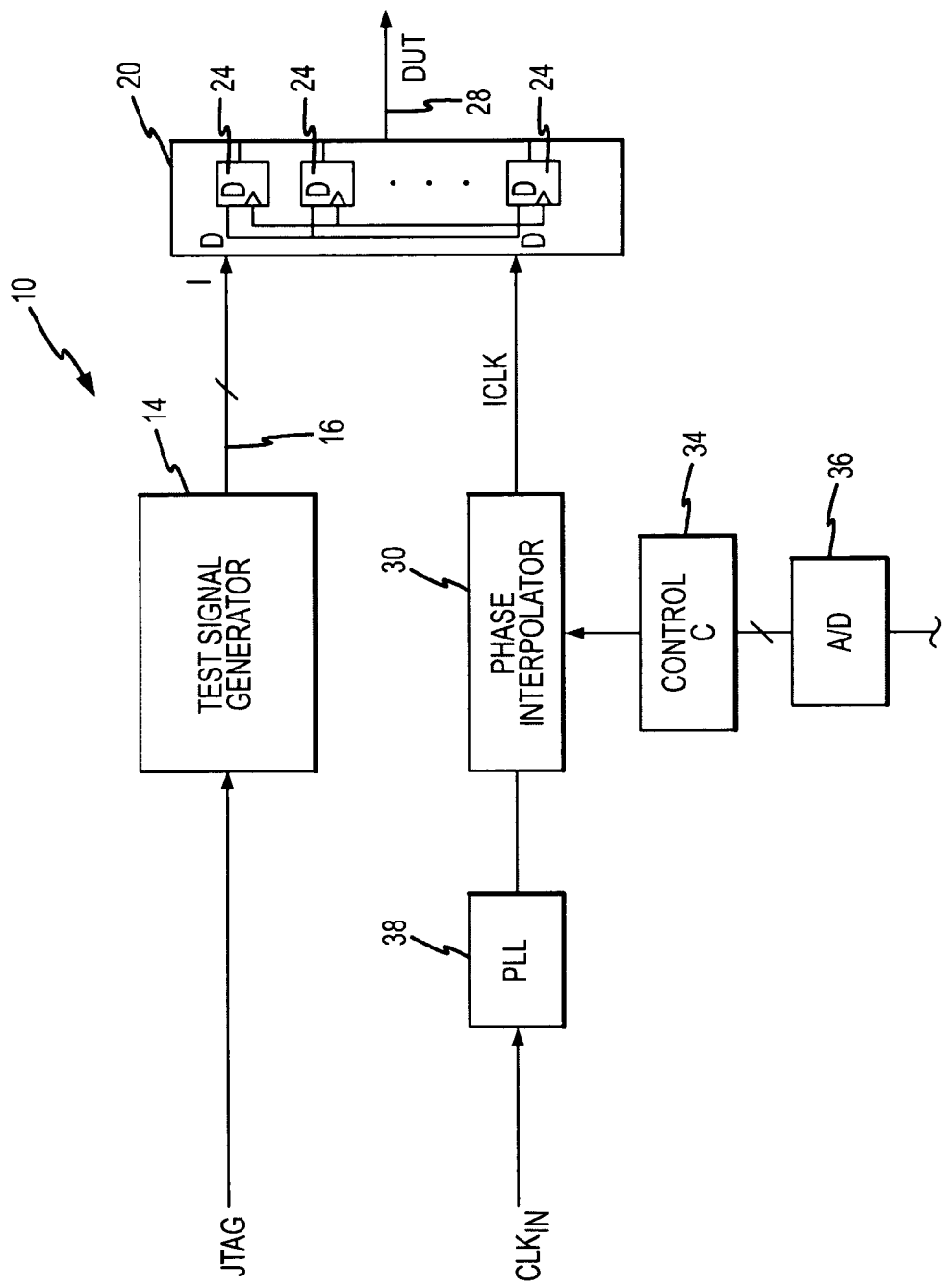
FIG. 1 is a block diagram of one example of a prior test system that attempts to inject jitter in signals used to test digital integrated circuits.
Figure 2:
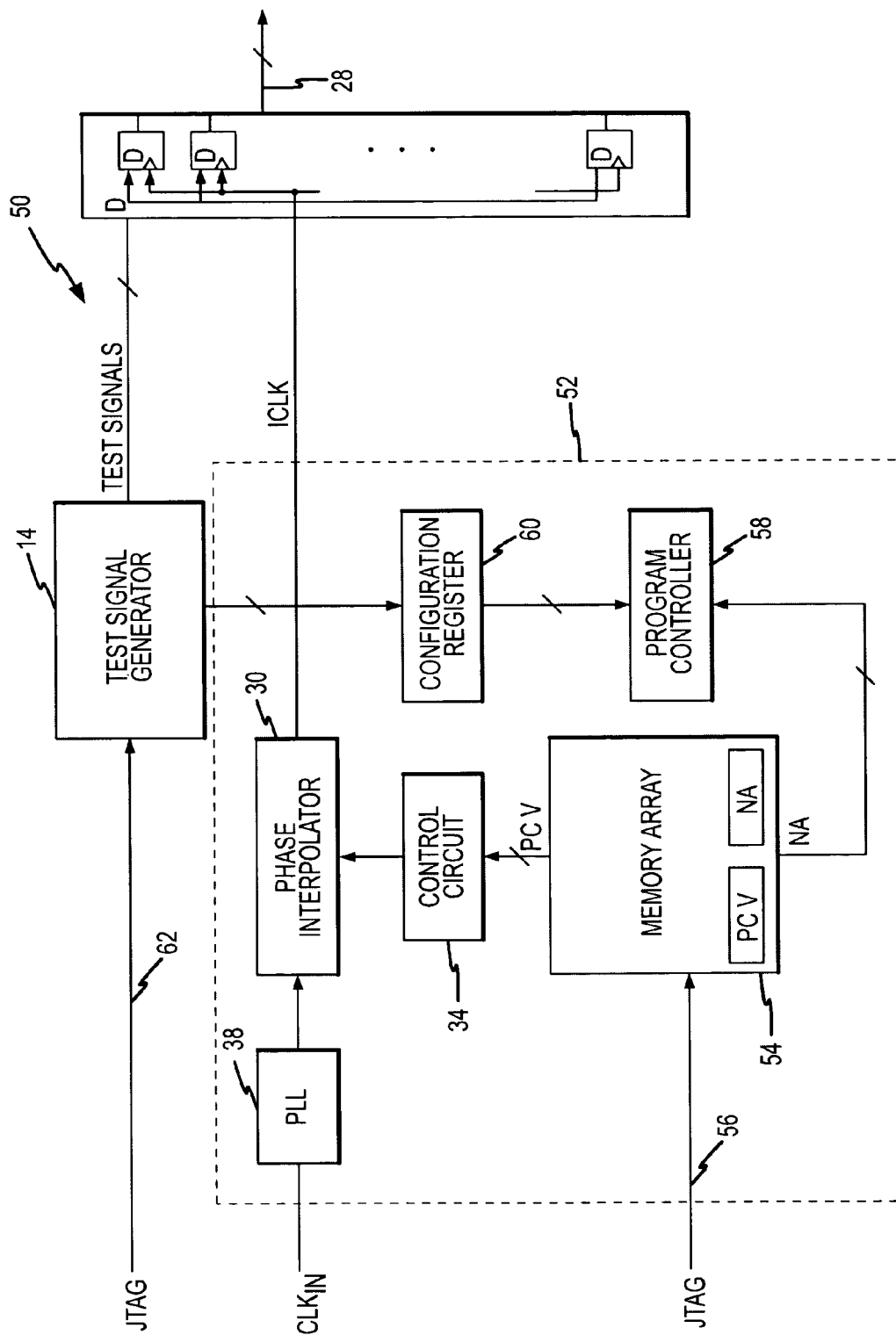
FIG. 2 is a block diagram of a test system according to one example of the invention, which attempts to inject jitter in signals used to test digital integrated circuits.

A test system 50 according to one example of the present invention is shown in FIG. 2. The test system 50 includes a clock phase adjustment system 52 that uses some of the same components that are used in the prior art test system 10 of FIG. 1. Therefore, in the interest of brevity, an explanation of their operation will not be repeated. The test system 50 differs from the test system 10 shown in FIG. 1 in the manner in which the clock jitter system generates the phase control values that are applied to the control input of the control circuit 34. More specifically, in the test system 50, the phase control values are read from a memory array 54 at a location corresponding to an address from a program controller 58.

As shown in FIG. 2, the memory array 54 includes two fields at each address, namely the phase control value ("PCV") field and a next address word ("NA") field. The memory array 54 may be programmed with the phase control value and next address word pairs through a JTAG interface 56. In operation, when the phase control value is applied to the control circuit 34, the next address is passed to the program controller 58. The program controller 58 then uses the next address for the next access of the memory array 54. On the first access to the memory array 54, the programmer controller 58 will not have received a next address from the memory array 54. Therefore, an initial address that is used by the program controller to initially access the memory array 54 is passed to the program controller 58 from a configuration register 60. The configuration register 60 is programmed with the initial address through the JTAG interface 62 of the test signal generator 14 through the test signal generator 14 and a bus 64.

In operation, the initial address that was provided to the program controller 58, as previously explained, is used by the program controller 58 to access the memory array 54. An initial phase control value stored in the array 54 at the initial address is then applied to the control input of the control circuit 34. The control circuit 34 causes the phase interpolator 30 to increase or decrease the phase of the ICLK signal by a magnitude corresponding to the magnitude of the initial phase control value. When the array 54 is accessed at the initial address, the next address stored at the initial address is also passed to the program controller 58. This next address is then used to access the next phase control value stored in the array 54. When the next phase control value is passed to the control circuit 34, the control circuit 34 causes the phase interpolator to change the phase of the ICLK signal by a magnitude and polarity corresponding to the value of the next phase control value. The operation proceeds in this manner until the phase control value stored in the array 54 at a final address is reached. At this final address, the next address field is either blank, or it links to an address that prevents further phase control values from being accessed. Alternatively, a final address may be stored into the program controller 58 in the same manner that the initial address is stored in the program controller 58. In such case, the program controller compares each "next address" to the final address, and halts the passing of addresses to the memory array 54 in the event of a match.

By properly selecting the next addresses that are used to program the array 54, the addresses in the array 54 can be accessed in a loop so that the array 54 can output phase control values indefinitely. In fact, the array 54 can store next addresses arranged in several different loops so that the corresponding phase control values can create different jitter algorithms. Each of these jitter algorithms can be selected by programming the configuration register 60 with an initial address that links to the selected loop.

The phase control values stored in the memory array 54 are preferably chosen so that the phase control values sequentially read from the array 54 will have magnitudes that vary in a fairly random manner. As a result, the phase shifts provided by the phase interpolator 30 can accurately simulate the type of phase jitter that the device under test can be expected to encounter in normal operation.

Figure 3:
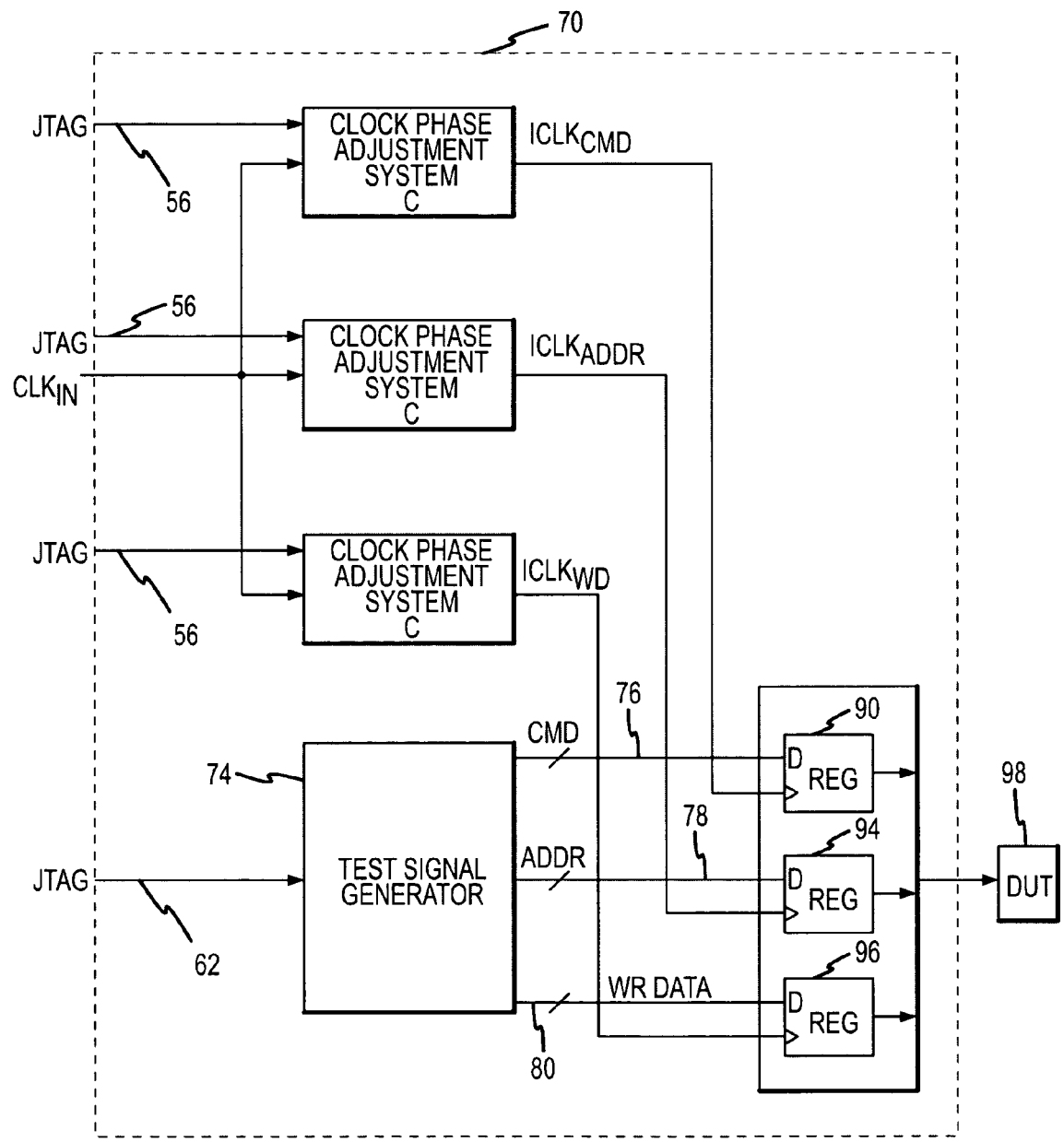
FIG. 3 is a block diagram of a system for testing memory devices according to one example of the invention.

A system 70 for testing memory devices according to one example of the invention is shown in FIG. 3. The memory testing system 70 includes a test signal generator 74 that is similar to the test signal generator 14 used in the example of FIG. 2. The test signal generator 74 generates three sets of parallel signals. The test signal generator 74 outputs a set of command signals (which may include a write data strobe signal) on a command bus ("CMD") 76, a set of address signals on an address bus ("ADDR") 78, and a set of write data signals on a write data bus ("WD") 80. Each of these sets of signals are sometimes referred to as "pin groups" of signals.

The command signals are applied to the respective data inputs of a plurality of command registers 90 (although only one command register 90 is shown for purposes of clarity). Similarly, the address signals are applied to the respective data inputs of a plurality of address registers 94, and the write data signals are applied to the respective data inputs of a plurality of write data registers 96. The outputs of the registers 90, 94, 96 are applied to the command bus, address bus and data bus of a memory device 99 that is being tested.

The clock inputs of the command registers 90 receive a first internal clock signal $ICLK_{CMD}$, the clock inputs of the address registers 94 receive a second internal clock signal $ICLK_{ADDR}$, and the clock inputs of the write data registers 96 receive a third internal clock signal $ICLK_{WD}$. These internal clock signal are generated by respective clock phase adjustment systems 52 of the type used in the test system 50 of FIG. 2. The memory array 54 in each of the clock phase adjustment systems 52 may be individually programmed through the JTAG interface 56 with phase control values and next addresses so that the clock phase adjustment systems 52 may provide different clock jitter algorithms. Furthermore, each of the systems 52 may receive a different initial address from the test signal generator 74 through the JTAG interface 62, as explained above.

In normal operating environments, the phase jitter of the command signals, may be different from the phase jitter of the address signals, and the phase jitter of both of those signals may be different from the phase jitter of the write data signals. Therefore, by allowing the phase jitter of each pin group of signals to be individually controlled, the memory testing system 70 provides a realistic testing environment that accurately simulates the normal operating environment of the memory device 98.

Although the memory testing system 70 uses three separate clock phase adjustment systems 52 to provide the three internal clock signals $ICLK_{CMD}$, $ICLK_{ADDR}$, and $ICLK_{WD}$, it should be understood that certain components of a clock phase adjustment system 52 may be shared. For example, three phase control values and a next address can be stored in each location in a single memory array 54. The single array 54 would then be accessed by a single program controller 58 and configuration register 60. The three phase control values output from the array 54 would be coupled to respective phase interpolators 30. The three phase interpolators 30 would then output the internal clock signals $ICLK_{CMD}$, $ICLK_{ADDR}$, and $ICLK_{WD}$, respectively, which would be coupled to the clock inputs of the command registers 90, the address registers 94 and the write data registers 96, respectively.

Figure 4:
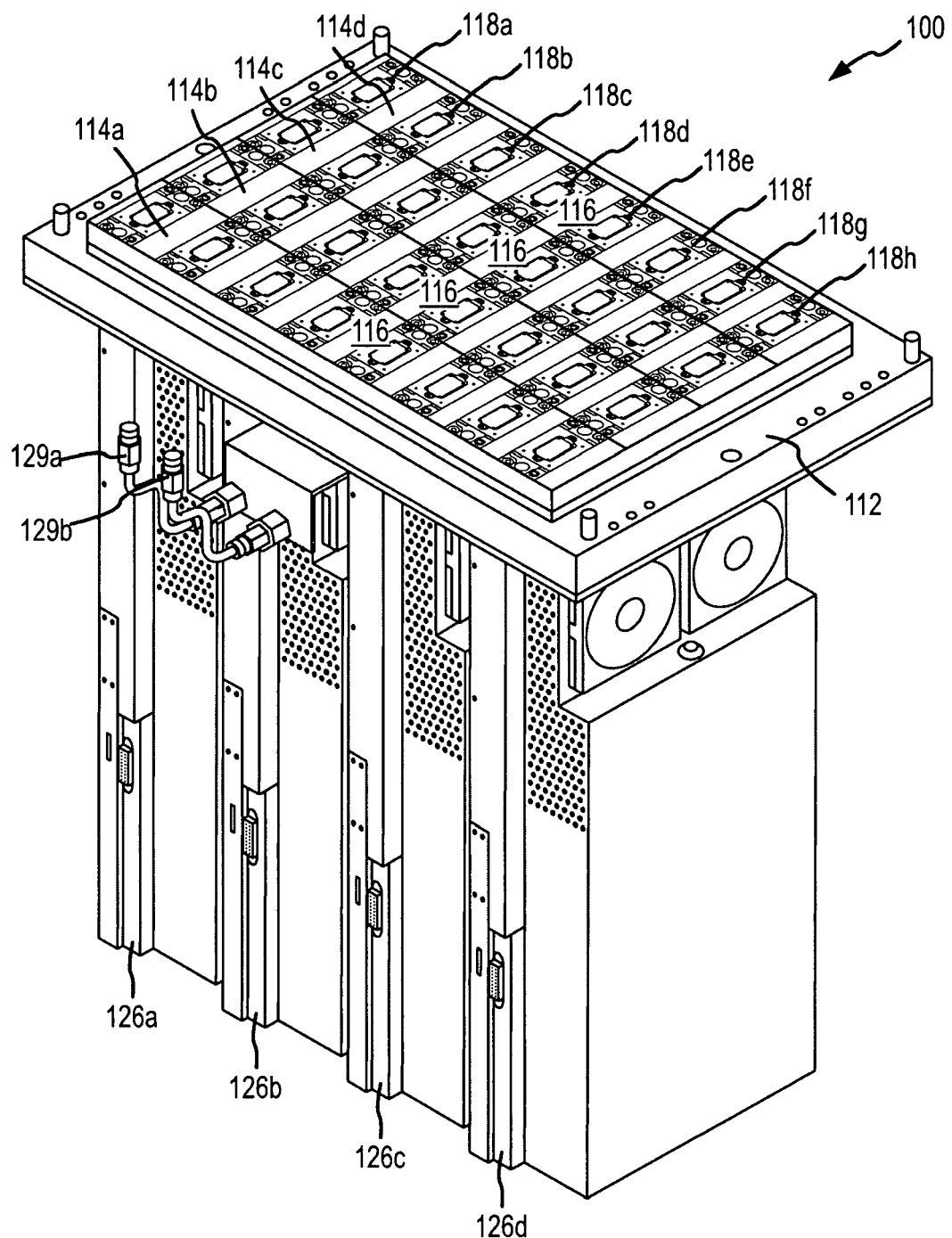
FIG. 4 is an isometric view of a test system according to one example of the invention.

A test system 100 using the memory testing system 70 according to one example of the invention is illustrated in FIG. 4. The test system 100 includes a test head 112 on which several load boards 114a-d are placed. Each of the load boards 114a-d have a printed circuit substrate 116 on which several integrated circuit sockets 118a-h are mounted. Each of the integrated circuit sockets 118a-h receives a respective integrated circuit memory device (not shown in FIG. 4). In the example shown in FIG. 4, the sockets 118a-h are adapted to receive dynamic random access memory ("DRAM") devices. Prior to final testing of the memory devices, an integrated circuit handler loads a memory device into each of the sockets 118a-h, and then places each of the load boards 114a-d on the test head 112.

Figure 5A:
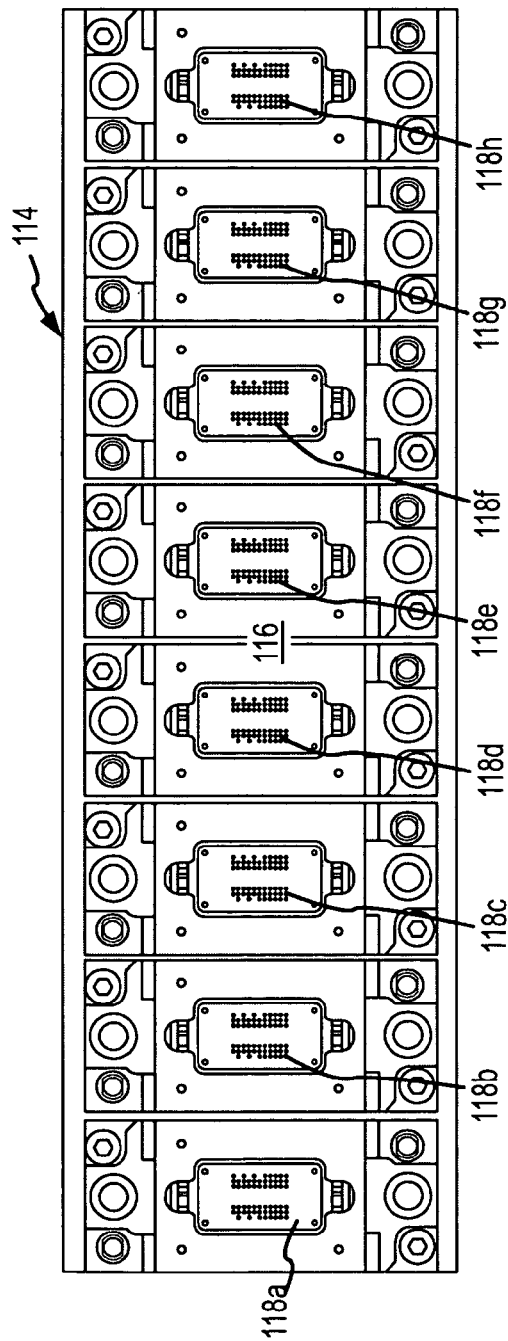
FIGS. 5A and 5B are top and bottom plan views, respectively, of a load board used in the test system of FIG. 4.
Figure 5B:
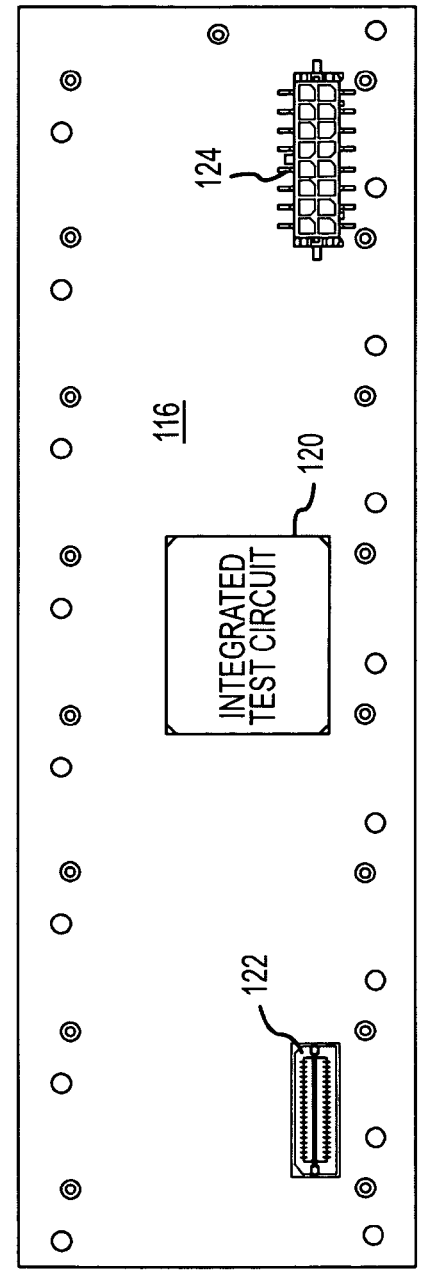

As explained in greater detail below, each of the load boards 114a-d includes an integrated test circuit (not shown in FIG. 4) mounted on the surface of the substrate 116 opposite the surface on which the sockets 118a-h are mounted. The sockets 118a-h are shown mounted on the upper surface of the substrate 116 in greater detail in FIG. 5A. The lower surface of the substrate 116 is shown in FIG. 5B. An integrated test circuit 120 is mounted at the center of the substrate 116, and it is connected to the sockets 118a-h through conventional printed circuit traces (not shown in FIG. 5B). Also mounted on the lower surface of the substrate 116 are a conventional JTAG connector 122 and a power supply connector 124, which are used as the JTAG interfaces 56, 62 (FIG. 3). High-level test commands are applied to the test circuit 120 through the JTAG connector 122, and high-level results data are received from the test circuit 120 through the JTAG connector 122. Power is applied to the test circuit 120 as well as to integrated circuits mounted in the sockets 118a-h through the power supply connector 124.

According to one embodiment of the invention, the integrated test circuit 120 uses the memory testing system 70 or some other example of the invention to inject phase jitter into the command, address, and write data signals applied to the memory devices in the sockets 118a-h. The memory arrays 54 (FIG. 2) and the configuration register 60 in each of the clock phase adjustment systems 52 is programmed through the JTAG connector 122 in the manner explained above with reference to FIG. 2.

In operation, the test circuit 120 applies predetermined command, address and write data signals to the integrated circuits mounted in the sockets 118a-h to write data into the memory devices in the sockets 118a-h. The test circuit 120 then receives read data from the memory devices, and it determines whether the data read from each address corresponds to the data written to the same addresses. Insofar as the integrated test circuit 120 is mounted on the same substrate 116 as the memory devices being tested, the timing at which the pattern of signals are applied to the memory devices can be more precisely controlled. Furthermore, the relatively short length of the conductors extending from the integrated test circuit 120 to the memory devices in the sockets 118a-h allows the circuitry in the integrated test circuit 120 to be less complex and therefore less expensive than with testers in which a pattern of test signals is applied through a long cable. In fact, the close proximity between the integrated test circuit 120 and the memory devices being tested will normally be similar to the proximity between the memory devices and memory access devices in normal operation. The test system 100 therefore accurately replicates the normal operating environment of the memory device in both the presence of phase jitter and the path length of signals coupled to and from the memory devices.

With further reference to FIG. 4, the test head 112 is mounted on the upper ends of several power supplies 126a-d, which generate DC supply voltages at respective magnitudes for use by the test head 112 and the load boards 114a-d. As mentioned above, the DC supply voltages are applied to the test head 112 through the power supply connector 124 (FIG. 5B). The test head 112 also includes fluid couplings 129a,b that receive and discharge a cooling fluid, respectively, for maintaining the temperature of the test circuit 120 at a stable acceptably cool temperature.

From the foregoing it will be appreciated that, although specific embodiments of the invention have been described herein for purposes of illustration, it will be understood by one skilled in the art that various modifications may be made without deviating from the spirit and scope of the invention. Accordingly, the invention is not limited except as by the appended claims.

What is claimed is:

1. A system for injecting phase jitter in a digital signal, comprising:
   a delay circuit having an input to which an input clock signal is applied, the delay circuit being configured to delay the input clock signal to provide a delayed clock signal, the delayed clock signal being delayed from the input clock signal by a delay corresponding to a delay control value applied to a control input of the delay circuit;
   a memory array storing a plurality of the delay control values at respective addresses, the memory array being coupled to the delay circuit to provide one of the delay control values to the delay circuit when the memory array is accessed at a corresponding address;
   a memory array access circuit coupled to the memory array, the memory array access circuit sequentially addressing the memory array to cause the memory array to sequentially apply delay control values to the delay circuit; and
   an interface circuit coupled to receive the delayed clock signal and the digital signal, the interface circuit being configured to transmit samples of the digital signal responsive to transitions of the delayed clock signal.

2. The system of claim 1 wherein the delay circuit comprises a phase interpolator that is configured to phase shift the input clock signal by a magnitude corresponding to the delay control values applied to the delay circuit.

3. The system of claim 1 wherein the memory array stores a respective next address with each of the delay control values stored in the memory array, and wherein the memory array access circuit comprises a program controller coupled to the memory array, the program controller being configured to receive the next address stored at an address being accessed in the memory array and to subsequently apply to the memory array the received next address to cause the memory array to output the delay control value stored at the next address.

4. The system of claim 3, further comprising a configuration register coupled to the program controller, the configuration register being configured to store and apply to the program controller an initial address that is transferred to the memory array by the program controller for an initial access of the memory array.

5. The system of claim 1 further comprising a phase-lock loop coupled to the input of the delay circuit, the phase-lock loop being configured to receive a clock signal at an input and to generate the input clock signal at its output.

6. The system of claim 1 wherein the interface circuit comprises a register having a clock input, a data input and an output, the data input of the register coupled to receive the digital signal, and the clock input of the register coupled to receive the delayed clock signal from the delay circuit.

7. A test system comprising:
   a test signal generator configured to generate a plurality of test signals;
   a delay circuit having an input to which an input clock signal is applied, the delay circuit being configured to delay the input clock signal to provide a delayed clock signal, the delayed clock signal being delayed from the input clock signal by a delay corresponding to a delay control value applied to a control input of the delay circuit;
   a memory array storing a plurality of the delay control values at respective addresses, the memory array being coupled to the delay circuit to provide one of the delay control values to the delay circuit when the memory array is accessed at a corresponding address;
   a memory array access circuit coupled to the memory array, the memory array access circuit sequentially addressing the memory array to cause the memory array to sequentially apply delay control values to the delay circuit; and
   an interface circuit coupled to receive the delayed clock signal and the test signals, the interface circuit being configured to transmit the test signals responsive to transitions of the delayed clock signal.

8. The test system of claim 7 wherein the delay circuit comprises a phase interpolator that is configured to phase shift the input clock signal by a magnitude corresponding to the delay control values applied to the delay circuit.

9. The test system of claim 7 wherein the memory array stores a respective next address with each of the delay control values stored in the memory array, and wherein the memory array access circuit comprises a program controller coupled to the memory array, the program controller being configured to receive the next address stored at an address being accessed in the memory array and to subsequently apply to the memory array the received next address to cause the memory array to output the delay control value stored at the next address.

10. The test system of claim 9, further comprising a configuration register coupled to the program controller, the configuration register being configured to store and apply to the program controller an initial address that is transferred to the memory array by the program controller for an initial access of the memory array.

11. The test system of claim 7 further comprising a phase-lock loop coupled to the input of the delay circuit, the phase-lock loop being configured to receive a clock signal at an input and to generate the input clock signal at its output.

12. The test system of claim 7 wherein the interface circuit comprises a plurality of registers each of which has a clock input, a data input and an output, the data input of each of the registers coupled to receive a respective one of the test signals, the clock input of the registers being coupled to receive the delayed clock signal from the delay circuit, and the outputs of the registers being coupled to output terminals of the test system.

13. The test system of claim 7 wherein the test signals comprise memory command signals.

14. The test system of claim 7 wherein the test signals comprise memory address signals.

15. The test system of claim 7 wherein the test signals comprise write data signals.

16. The test system of claim 7 wherein the test signals are divided into a first group comprising memory command signals, a second group comprising memory address signals, and a third group comprising write data signals.

17. A memory device testing system comprising:
   a test signal generator configured to generate a set of command signals, a set of address signals and a set of write data signals;
   first, second and third delay circuits each of which have an input to which an input clock signal is applied, the delay circuits being configured to delay the input clock signal to provide respective first, second and third delayed clock signals that are delayed from the input clock signal by respective delays corresponding to respective first, second and third delay control values applied to control inputs of the first, second and third delay circuits, respectively;

at least one memory array storing a plurality of the first, second and third delay control values at respective addresses, the at least one memory array being coupled to the first, second and third delay circuits to provide the first, second and third delay control values, respectively, to the first, second and third delay circuits, respectively, when the at least one memory array is accessed at a corresponding address;

at least one memory array access circuit coupled to the at least one memory array, the at least one memory array access circuit sequentially addressing the at least one memory array to cause the at least one memory array to sequentially apply corresponding first, second and third delay control values to the control inputs of the first, second and third delay circuits, respectively; and an interface circuit coupled to receive the first, second and third delayed clock signals and the command, address and write data signals, the interface circuit being configured to transmit the command signals responsive to transitions of the first delayed clock signal, to transmit the address signals responsive to transitions of the second delayed clock signal, and to transmit the write data signals responsive to transitions of the third delayed clock signal.

18. The memory device testing system of claim 17 wherein the at least one memory array comprises:

a first memory array storing at each address one of the first delay control values and a first next address, the first memory array being addressed by the at least one memory array access circuit to cause the first memory array to sequentially apply corresponding first delay control values to the control input of the first delay circuit;

a second memory array storing at each address one of the second delay control values and a second next address, the second memory array being addressed by the at least one memory array access circuit to cause the second memory array to sequentially apply corresponding second delay control values to the control input of the second delay circuit; and a third memory array storing at each address one of the third delay control values and a third next address, the third memory array being addressed by the at least one memory array access circuit to cause the third memory array to sequentially apply corresponding third delay control values to the control input of the third delay circuit.

19. The memory device testing system of claim 18 wherein the at least one memory array access circuit comprises:

a first memory array access circuit sequentially addressing the first memory array to cause the first memory array to sequentially apply corresponding first delay control values to the control input of the first delay circuit;

a second memory array access circuit sequentially addressing the second memory array to cause the second memory array to sequentially apply corresponding second delay control values to the control input of the second delay circuit; and a third memory array access circuit sequentially addressing the third memory array to cause the third memory array to sequentially apply corresponding third delay control values to the control input of the third delay circuit.

20. The memory device testing system of claim 17 wherein the first, second and third delay circuits comprise respective first, second and third phase interpolators that are configured to phase shift the input clock signal by a magnitude corresponding to the first, second and third delay control values, respectively.

21. The memory device testing system of claim 17 wherein the at least one memory array stores a respective next address with each of the first, second and third delay control values stored in the at least one memory array, and wherein the at least one memory array access circuit comprises at least one program controller coupled to the at least one memory array, the at least one program controller being configured to receive the next address stored at an address being accessed in the at least one memory array and to subsequently apply to the at least one memory array the received next address to cause the at least one memory array to output the first, second and third delay control values stored at the next addresses.

22. The memory device testing system of claim 21, further comprising at least one configuration register coupled to the at least one program controller, the at least one configuration register being configured to store and apply to the at least one program controller at least one initial address that is transferred to the at least one memory array by the at least one program controller for an initial access of the at least one memory array.

23. The memory device testing system of claim 17 further comprising a phase-lock loop coupled to the input of the first, second and third delay circuit, the phase-lock loop being configured to receive a clock signal at an input and to generate the input clock signal at its output.

24. The memory device testing system of claim 17 wherein the interface circuit comprises:

a plurality of command registers each of which has a clock input, a data input and an output, the data input of each of the command registers coupled to receive a respective one of the command signals, and the clock input of each of the command registers being coupled to receive the first delayed clock signal from the first delay circuit;

a plurality of address registers each of which has a clock input, a data input and an output, the data input of each of the address registers coupled to receive a respective one of the address signals, and the clock input of each of the address registers being coupled to receive the second delayed clock signal from the second delay circuit; and a plurality of write data registers each of which has a clock input, a data input and an output, the data input of each of the write data registers coupled to receive a respective one of the write data signals, and the clock input of each of the write data registers being coupled to receive the third delayed clock signal from the third delay circuit.

25. The memory device testing system of claim 17 wherein the command signals comprise dynamic random access memory device command signals.

26. An integrated circuit load board, comprising:

a substrate;

a plurality of integrated circuit sockets mounted on the substrate; and an integrated test circuit mounted on the substrate and coupled to the integrated circuit sockets, the integrated test circuit comprising:

a test signal generator configured to generate a plurality of test signals;

a delay circuit having an input to which an input clock signal is applied, the delay circuit being configured to delay the input clock signal to provide a delayed clock signal, the delayed clock signal being delayed from the input clock signal by a delay corresponding to a delay control value applied to a control input of the delay circuit;

a memory array storing a plurality of the delay control values at respective addresses, the memory array being coupled to the delay circuit to provide one of the delay control values to the delay circuit when the memory array is accessed at a corresponding address;

a memory array access circuit coupled to the memory array, the memory array access circuit sequentially addressing the memory array to cause the memory array to sequentially apply corresponding delay control values to the delay circuit; and an interface circuit coupled to receive the delayed clock signal and the test signals, the interface circuit being configured to transmit the test signals to the integrated circuit sockets responsive to transitions of the delayed clock signal and to receive response signals from the integrated circuit sockets, the integrated test circuit having an output port from which test results data derived from the response signals are output.

27. The load board of claim 26 wherein the delay circuit comprises a phase interpolator that is configured to phase shift the input clock signal by a magnitude corresponding to the delay control values applied to the delay circuit.

28. The load board of claim 26 wherein the memory array stores a respective next address with each of the delay control values stored in the memory array, and wherein the memory array access circuit comprises a program controller coupled to the memory array, the program controller being configured to receive the next address stored at an address being accessed in the memory array and to subsequently apply to the memory array the received next address to cause the memory array to output the delay control value stored at the next address.

29. The load board of claim 28, further comprising a configuration register coupled to the program controller, the configuration register being configured to store and apply to the program controller an initial address that is transferred to the memory array by the program controller for an initial access of the memory array.

30. The load board of claim 26 further comprising a phase-lock loop coupled to the input of the delay circuit, the phase-lock loop being configured to receive a clock signal at an input and to generate the input clock signal at its output.

31. The load board of claim 26 wherein the interface circuit comprises a plurality of registers each of which has a clock input, a data input and an output, the data input of each of the registers coupled to receive a respective one of the test signals, the clock input of the registers being coupled to receive the delayed clock signal from the delay circuit, and the outputs of the registers being coupled to output terminals of the test system.

32. The load board of claim 26 wherein the test signals comprise memory command signals.

33. The load board of claim 26 wherein the test signals comprise memory address signals.

34. The load board of claim 26 wherein the test signals comprise write data signals.

35. The load board of claim 26 wherein the test signals are divided into a first group comprising memory command signals, a second group comprising memory address signals, and a third group comprising write data signals.

36. The load board of claim 26, further comprising a respective integrated circuit in each of the integrated circuit sockets in communication with the integrated test circuit.

37. The load board of claim 36 wherein each of the integrated circuits comprise a dynamic random access memory device.

* * * * *